United States Patent [19]
Erickson

[11] Patent Number: 5,862,466
[45] Date of Patent: Jan. 19, 1999

[54] METHOD AND APPARATUS FOR AUTOMATICALLY BALANCING A RADIO-FREQUENCY MIXER

[75] Inventor: Bruce A. Erickson, Santa Rosa, Calif.

[73] Assignee: Hewlett-Packard Company, Palo Alto, Calif.

[21] Appl. No.: 781,564

[22] Filed: Jan. 9, 1997

[51] Int. Cl.[6] .............................. H04B 1/26; H04B 1/10
[52] U.S. Cl. .................... 455/326; 455/324; 455/304; 455/305; 455/296
[58] Field of Search ................... 455/304, 317, 455/326, 310, 305, 333, 296, 302, 324

[56] References Cited

U.S. PATENT DOCUMENTS

| | | | |
|---|---|---|---|
| 4,584,712 | 4/1986 | Isobe et al. | 455/273 |
| 4,776,039 | 10/1988 | Akaiwa | 455/302 |
| 4,864,638 | 9/1989 | Zwarts | 455/333 |
| 5,046,133 | 9/1991 | Watanabe | 455/278.1 |
| 5,302,914 | 4/1994 | Aratz et al. | 455/126 |
| 5,404,589 | 4/1995 | Bijker et al. | 455/304 |
| 5,481,389 | 1/1996 | Pidgeon et al. | 455/303 |
| 5,548,838 | 8/1996 | Talwar et al. | 455/278.1 |
| 5,715,529 | 2/1998 | Kianush et al. | 455/324 |
| 5,724,653 | 3/1998 | Baker et al. | 455/28.1 |

FOREIGN PATENT DOCUMENTS

| | | | |
|---|---|---|---|
| 2032737 | 4/1980 | United Kingdom | 455/324 |

*Primary Examiner*—Thanh Cong Le
*Assistant Examiner*—Edan Orgad

[57] ABSTRACT

An automatic balancing circuit for a radio frequency mixer which reduces LO-IF signal leakage, as well as minimizing second order harmonic distortion products is described. The circuit couples to in-phase and out-of-phase signal lines originating from the mixer, and comprises a differential gain network, a differential phase shift network and a combiner. The networks operate under the control of a microprocessor, which adjusts the networks so that the LO leakage signals, when combined, are almost completely eliminated.

7 Claims, 4 Drawing Sheets

METHOD AND APPARATUS FOR AUTOMATICALLY BALANCING A RADIO-FREQUENCY MIXER

BACKGROUND OF THE INVENTION

In known spectrum analyzers, the input mixer requires hand adjustment or uses specially selected mixer diodes to reduce local oscillator ("LO") to intermediate frequency ("IF") leakage. This leakage typically limits the low frequency performance of the spectrum analyzer and introduces residual undesired signals. This mechanical balancing is expensive and does not fully reduce second harmonic distortion products.

One known circuit to reduce LO-IF leakage in a spectrum analyzer is shown in FIG. 1. The LO nulling circuit has a phase quadrature ("IQ") modulator subsystem which generates a signal equal in amplitude and opposite in phase to the undesired LO leakage signal. This signal is coupled into the IF subsystem to cancel the leakage. As the mixer for the radio frequency ("RF") input signal and the LO signal is not actually balanced, second order harmonic distortion products are not significantly reduced. As the nulling circuit requires many RF components external to the mixer itself, this circuit is simply too expensive for a low cost spectrum analyzer.

SUMMARY OF THE INVENTION

A first preferred embodiment of the present invention comprises an automatic balancing circuit for an RF mixer, to be used primarily in a spectrum analyzer. A single balanced mixer with a balun on its IF port is used, the balun providing an "in-phase" and "out-of-phase" signal line, each line carrying a small amount of LO leakage signal, as well as the in-phase and out-of-phase IF signal. By adjusting the phase and amplitude of these signals properly, the adjusted signals can be recombined, canceling out the undesired LO leakage signal. A firmware algorithm automatically adjusts the phase and amplitude to 25 minimize the LO feedthrough when the LO frequency is set to the IF frequency. This adjustment remains in place as the spectrum analyzer operates.

When the present invention is balanced at the LO=IF frequency, the mixer will also be balanced for all other LO frequencies, greatly reducing second harmonic distortion products over the entire frequency range of the spectrum analyzer, because the balun continues to operate at the fixed IF frequency.

The present invention will now be described with reference to the figures listed and described below.

DESCRIPTION OF THE PREFERRED EMBODIMENT

Figure 1:
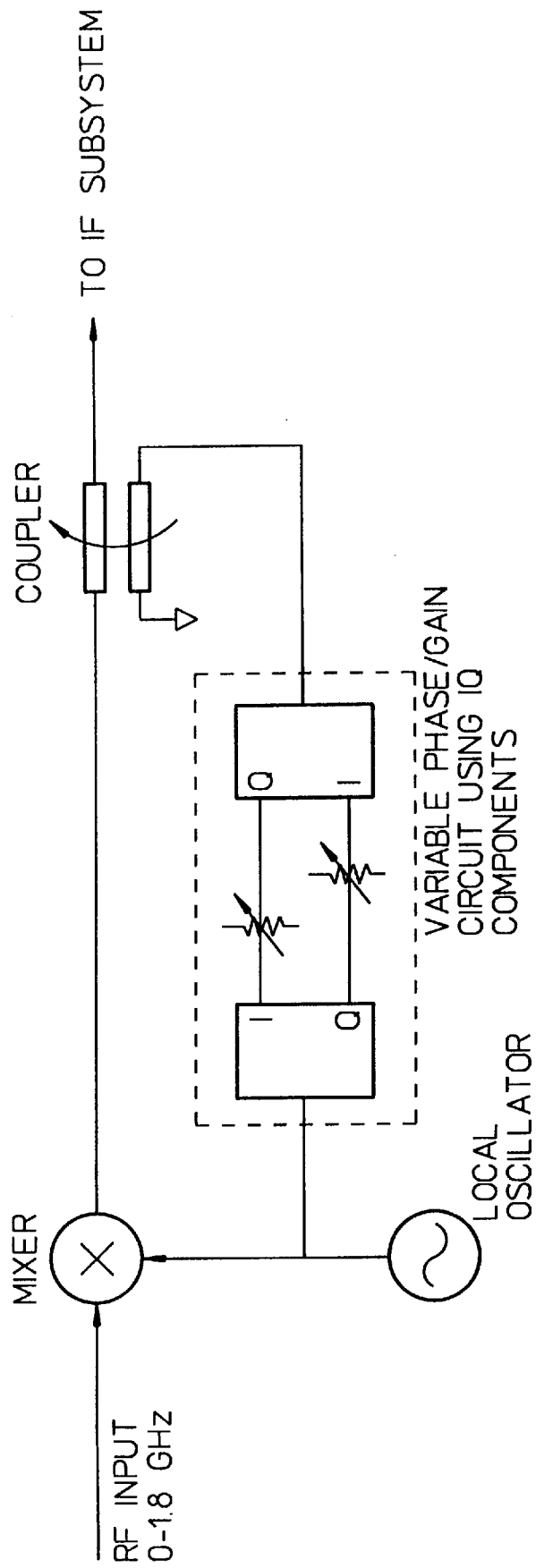
FIG. 1 is a block diagram of a known local oscillator-intermediate frequency nulling circuit (Prior Art)
Figure 2:
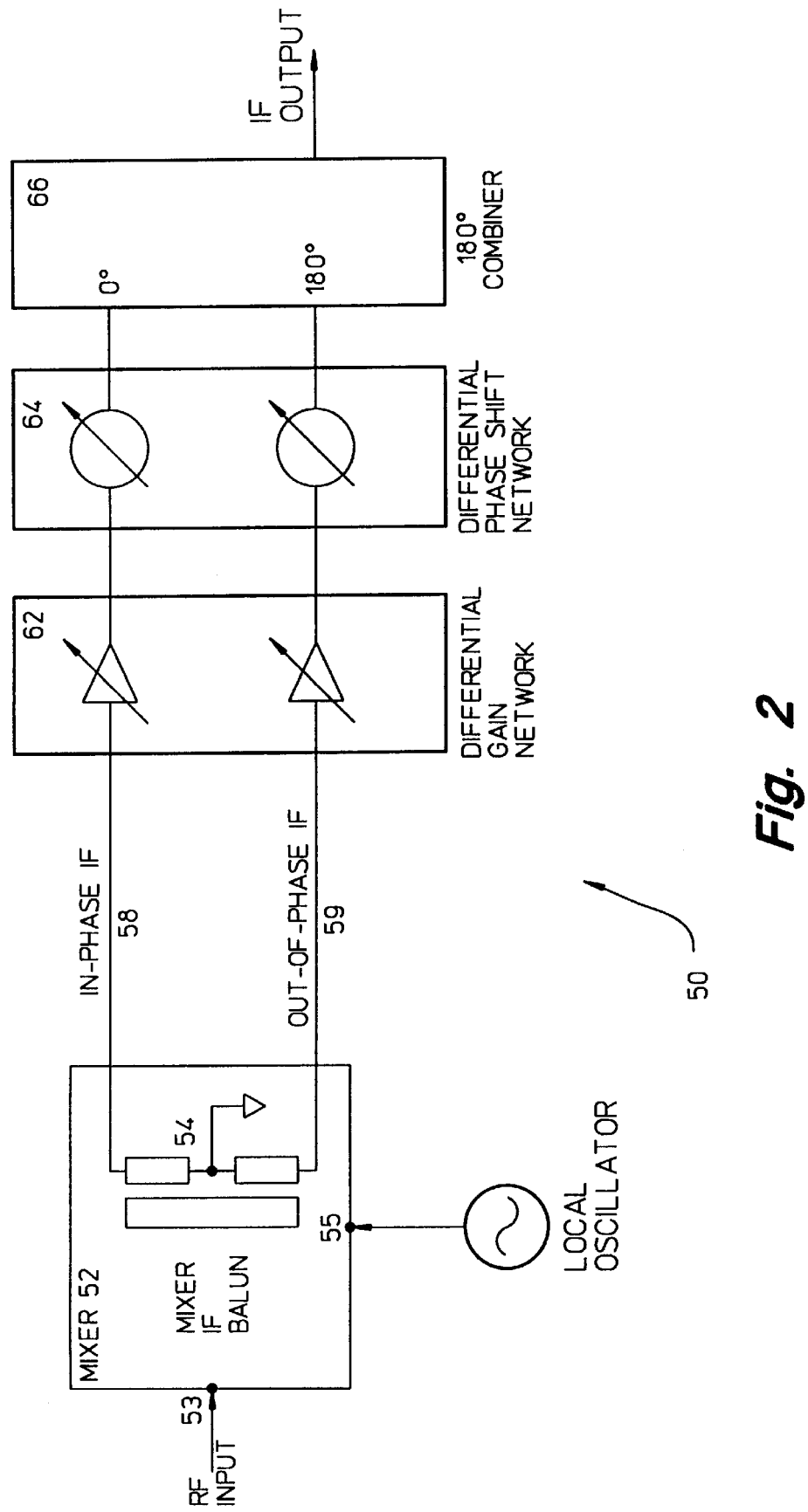
FIG. 2 is a functional block diagram of the preferred embodiment of the present invention.

The preferred embodiment of the present invention comprises an automatic balancing circuit for an RF mixer. As shown in FIG. 2, the balancing circuit 50 uses a single balanced mixer 52 having a balun 54. Mixer 52 accepts an RF signal on RF input port 53 and an LO input signal on LO input port 55. Although mixer 52 will ideally have very little LO signal leakage present at the output of balun 54, diode imperfections and mechanical asymmetry in balun 54 may result in unacceptably high LO leakage currents.

In the present invention, mixer 52 and balun 54 generate an in-phase and out-of-phase IF signal on IF coupling lines 58 and 59. Each line carries a small amount of LO leakage that is present at balun 54. The dominant component of this LO leakage will be approximately in phase on lines 58 and 59. By shifting the separate IF signals differentially in phase and/or amplitude in differential gain network 62 and differential phase shift network 64 and then combining the signals in a 180° hybrid combiner 66, it is possible to cancel the LO leakage due to the imperfect diodes and the mechanical asymmetries in balun 54 almost completely with little effect on the IF signal level. As the present invention requires an in-phase and out-of-phase IF signal to be present on lines 58 and 59, respectively, mixer 52 and balun 54 are specially designed and constructed. Their design and construction are fully described in a co-filed, co-pending, and commonly assigned patent application entitled "Resonator For Coupling IF Signals From An RF Mixer." That specification is incorporated herein for all purposes.

The LO signal leakage which flows around the mixer and hence directly into the IF section can be minimized by proper shielding to insure that balun 54 and the mixer diodes are the dominant leakage path.

Figure 3:
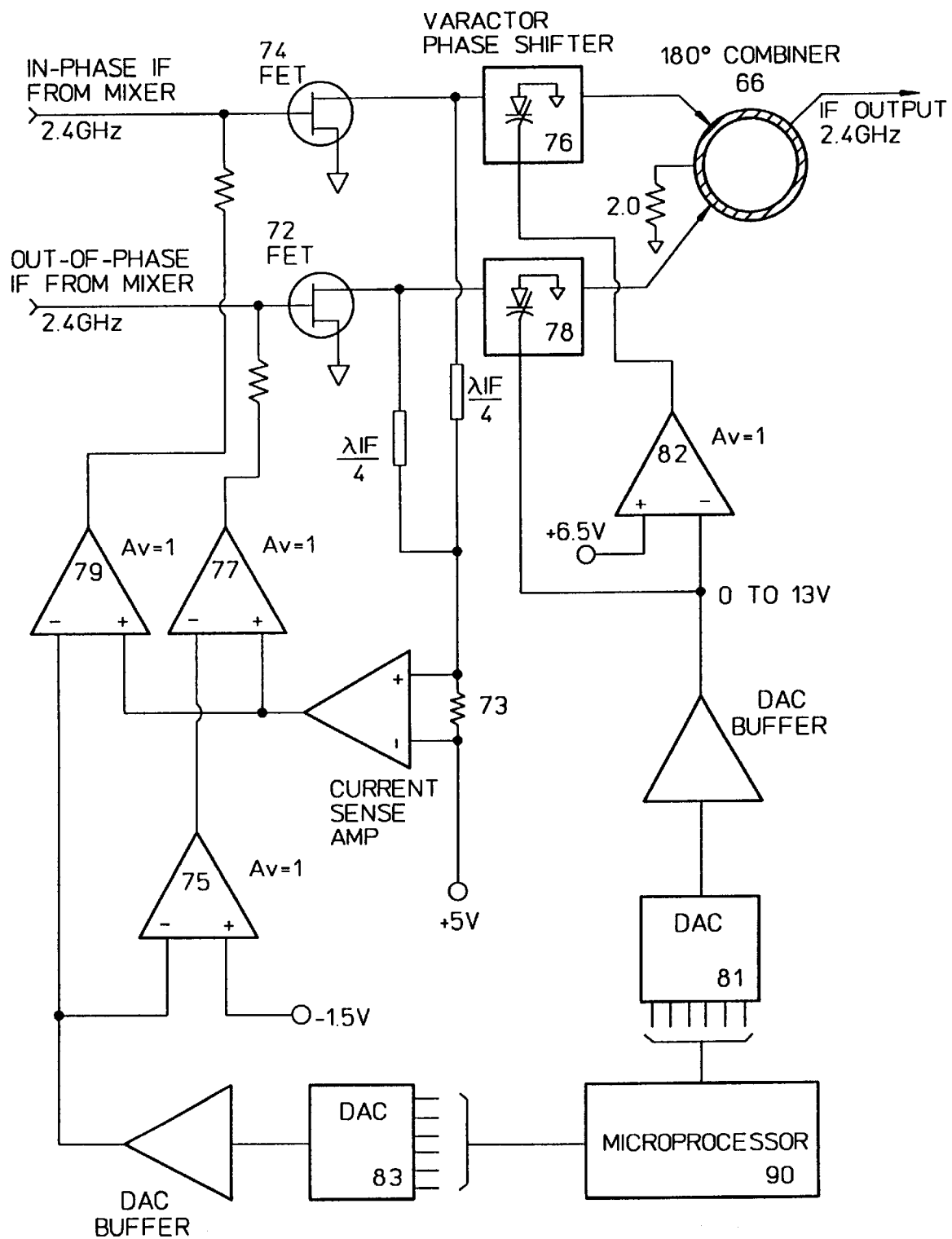
FIG. 3 is a circuit diagram of the preferred embodiment of the present invention.

Given the design of mixer 52 and balun 54, only very small phase and amplitude shifts are needed in the present invention. As shown in FIG. 3, amplitude variation to realize the function of differential gain network 62 (see FIG. 2) is accomplished by varying the bias current to GaAs Field Effect Transistor ("FET") amplifiers 72 and 74. The differential phase shift network 64 (see FIG. 2) is realized by varactor resonators 76 and 78. An analog control circuit attached to the drains of FETs 72 and 74 and comprised of current sense amplifier 73 and amplifiers 75, 77, and 79 maintains the total drain current of FETs 72 and 74 constant, but shifts current differentially between FETs 72 and 74. Control of varactor phase shifters 76 and 78 is by means of a complimentary driver, comprised of amplifier 82. Phase Digital-to-Analog Control ("DAC") 81 and amplitude DAC 83 are coupled to microprocessor 90, under whose control both the differential phase shift network and the differential gain network amplitude are adjusted. 180° hybrid combiner 66 is realized in this first embodiment as a 180° rat-race coupler.

The circuit shown in FIG. 3 is only one possible implementation of the functions denoted in FIG. 2. The differential gain network could be implemented in several other ways, as could the differential phase shift network. For example, the differential gain network could be implemented by using attenuator ICs which have no FETs. Also, although the first preferred embodiment adjust the gain of the in-phase and out-of-phase signals before adjusting their phase, nothing herein should be taken to limit the present invention to that particular order of functions. The phase of the signals could just as easily be adjusted before the gain.

Figure 4:
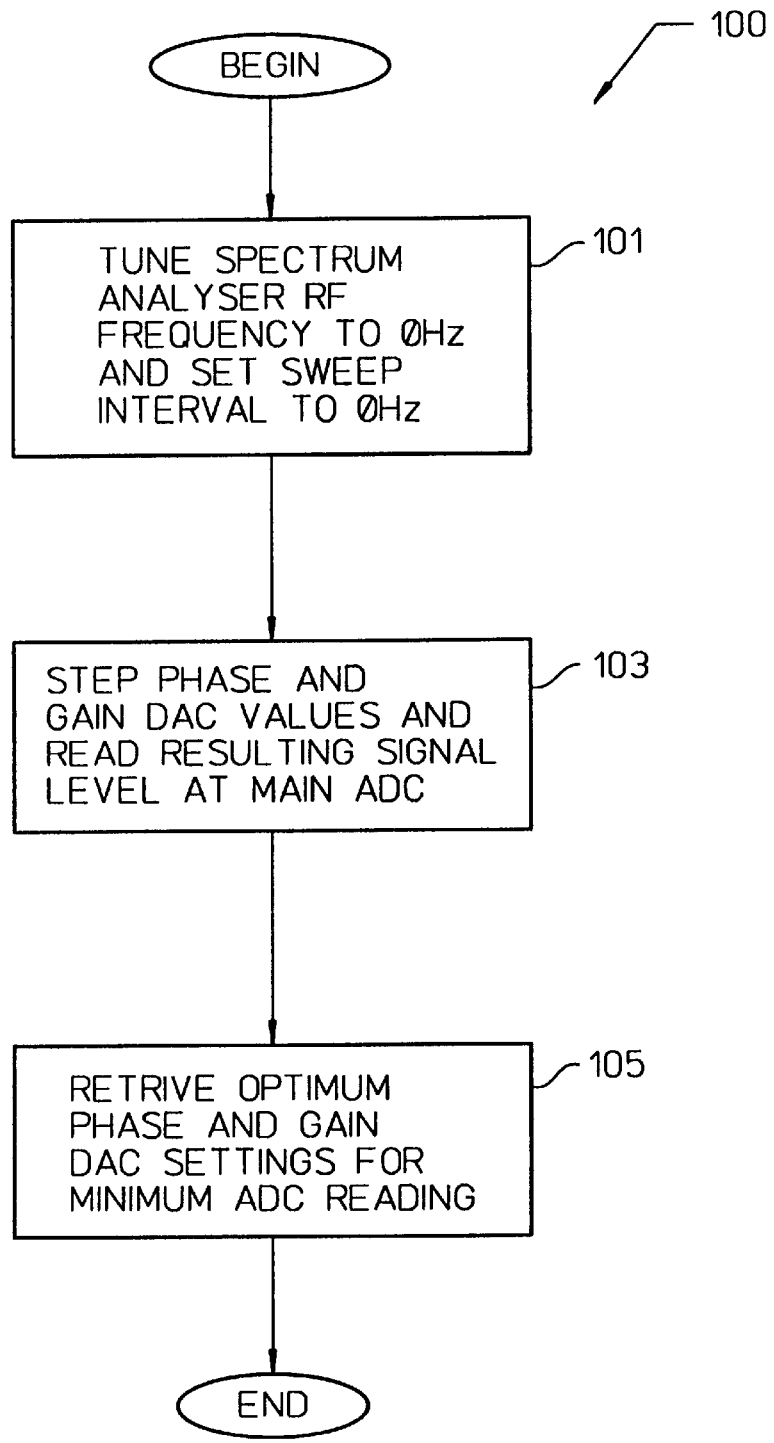
FIG. 4 is a flow chart showing the operation of the preferred embodiment of the present invention.

A firmware program executed by microprocessor 90 repeatedly adjusts the phase and amplitude of the in-phase and out-of-phase signals to minimize the LO leakage signal. This firmware program is executed prior to using the spectrum analyzer and begins by setting the LO frequency equal to the IF frequency. FIG. 4 is a flowchart of firmware program 100. At step 101, the spectrum analyzer's RF frequency is set to 0 Hz and the sweep interval is also set to 0 Hz. At step 103, the phase and gain DAC values on DACs 81 and 83 (see FIG. 3) are stepped, respectively, and microprocessor 90 (see FIG. 3) reads the spectrum analyzer's signal which is present at the output of the main analog-to-digital converter ("ADC") in the spectrum analyzer. This ADC is not illustrated. Using a known search routine to minimize the signal present at the main ADC, microprocessor 90 repeatedly performs step 103, where the differential gain and differential phase networks are adjusted and where the value present at the main ADC is read to see if the preceding adjustment increased or reduced the signal present at the main ADC. The best nulling values are loaded into the nulling DACs 81 and 83 at step 105 and the spectrum analyzer returns to the state it was in before running the firmware program.

By using balun 54 at the fixed IF frequency, when the mixer is balanced at the LO equals IF frequency, the mixer is also balanced for all other LO frequencies. Thus, second order harmonic distortion products, which result from imperfect mixer balance, are greatly reduced over the mixer's entire frequency range. In known mixer designs using a balun on the LO port, any balancing would be frequency dependent. Even if the LO feedthrough were nulled at the LO equals IF frequency, the mixer might not be balanced at other LO frequencies and second order harmonic distortion products would not necessarily be minimized. Also, as the present invention automatically calibrates and adjusts itself to reduce LO leakage, it operates much more cheaply than known hand adjusted circuits.

What is claimed is:

1. In a spectrum analyzer having a single balanced mixer with a balun for mixing a radio frequency input signal and a local oscillator input signal to produce an intermediate frequency signal, a circuit for minimizing leakage of the local oscillator signal into intermediate frequency circuitry, the circuit comprising:

an in-phase signal line and an out-of-phase signal line, the lines being coupled to the balun, the lines carrying an in-phase and an out-of-phase signal, respectively;

a differential gain network coupled to the in-phase and out-of-phase signal lines, the differential gain network adjusting the amplitude of the in-phase and out-of-phase signals;

a differential phase shift network coupled to the differential gain network, the differential phase shift network receiving the amplitude adjusted in-phase and out-of-phase signals and shifting the signals in phase;

a signal combiner coupled to the differential phase shift network for combining the amplitude and phase adjusted in-phase and out-of-phase signals; and a microprocessor coupled to the differential gain network and the differential phase shift network for determining and controlling the amplitude and phase adjustments.

2. The circuit of claim 1, wherein the differential gain network comprises:

a first and second field effect transistor, the gates of the transistors being respectively coupled to the in-phase and out-of phase signal lines;

a current sensing amplifier coupled to the drains of the transistors; and a digital-to-analog converter coupled to both the microprocessor and the gates of the transistors.

3. In a spectrum analyzer having a single balanced mixer with a balun for mixing a radio frequency in-put signal and a local oscillator input signal to produce an intermediate frequency signal, a circuit for minimizing leakage of the local oscillator signal into intermediate frequency circuitry, the circuit comprising:

an in-phase signal line and an out-of-phase signal line, the lines being coupled to the balun, the lines carrying an in-phase and an out-of-phase signal, respectively;

a differential gain network coupled to the in-phase and out-of-phase signal lines, the differential gain network adjusting the amplitude of the in-phase and out-of-phase signals;

a differential phase shift network coupled to the differential gain network, the differential phase shift network receiving the amplitude adjusted in-phase and out-of-phase signals and shifting the signals in phase;

a signal combiner coupled to the differential phase shift network for combining the amplitude and phase adjusted in-phase and out-of-phase signals; and a microprocessor coupled to the differential gain network and the differential phase shift network for determining and controlling the amplitude and phase adjustments, wherein the differential gain network comprises:

a first and second field effect transistor, the gates of the transistors being respectively coupled to the in-phase and out-of-phase signal lines;

a current sensing amplifier coupled to the drains of the transistors; and a digital-to-analog converter coupled to both the microprocessor and the gates of the transistors, and wherein the differential phase shift network comprises:

a first and second varactor phase shifter coupled respectively to the drains of the first and second transistors; and a digital-to-analog converter coupled to the microprocessor and the first and second varactors.

4. An apparatus for minimizing local oscillator signal leakage and second order distortion products generated by a mixer, the mixer having an in-phase signal output and an out-of-phase signal output, the apparatus comprising:

a microprocessor controlled phase shift network coupled to the in-phase signal output and the out-of-phase signal output for differentially adjusting the phase of the in-phase and out-of-phase signals;

a microprocessor controlled gain network coupled to microprocessor controlled phase shift network for differentially adjusting the gain of the phase adjusted in-phase and out-of-phase signals; and a combiner coupled to the microprocessor controlled gain network for combining the gain and phase adjusted in-phase and out-of-phase signals.

5. An apparatus for minimizing local oscillator signal leakage and second order distortion products generated by a mixer, the mixer having an in-phase signal output and an out-of-phase signal output, the apparatus comprising:

a microprocessor controlled phase shift network coupled to the in-phase signal output and the out-of-phase signal output for differentially adjusting the phase of the in-phase and out-of-phase signals;

a microprocessor controlled gain network coupled to the microprocessor controlled phase shift network for differentially adjusting the gain of the phase adjusted in-phase and out-of-phase signals; and a combiner coupled to the microprocessor controlled gain network for combining the gain and phase adjusted in-phase and out-of-phase signals, wherein the microprocessor controlled gain network comprises:
- a first and second field effect transistor, the gates of the transistors being respectively coupled to the in-phase and out-of-phase signal outputs;
- a current sensing amplifier coupled to the drains of the transistors; and
- a digital-to-analog converter coupled to both the microprocessor and the gates of the transistors.

6. The apparatus of claim 5 wherein the microprocessor controlled phase shift network comprises:
- a first and second varactor phase shifter coupled respectively to the drains of the first and second transistors; and
- a digital-to-analog converter coupled to the microprocessor and the first and second varactors.

7. A method for minimizing leakage of local oscillator signal into intermediate frequency circuitry, the method comprising the steps of:
- generating an in-phase and an out-of-phase signal from a mixer combining a local oscillator signal and a radio frequency input signal;
- adjusting the amplitude of the in-phase and out-of-phase signals in a microprocessor controlled gain network;
- adjusting the phase of the in-phase and out-of-phase signals in a microprocessor controlled phase shift network; and
- combining the phase and amplitude adjusted in-phase and out-of-phase signals in a signal combiner.

* * * * *